United States Patent
Anderson et al.

(10) Patent No.: US 10,957,794 B2
(45) Date of Patent: Mar. 23, 2021

(54) VERTICAL TRANSISTOR CONTACT FOR CROSS-COUPLING IN A MEMORY CELL

(71) Applicant: INTERNATIONAL BUSINESS MACHINES CORPORATION, Armonk, NY (US)

(72) Inventors: Brent A. Anderson, Jericho, VT (US); Terence B. Hook, Jericho, VT (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/747,838

(22) Filed: Jan. 21, 2020

(65) Prior Publication Data

US 2020/0161472 A1 May 21, 2020

Related U.S. Application Data

(63) Continuation of application No. 16/023,421, filed on Jun. 29, 2018, now Pat. No. 10,566,453.

(51) Int. Cl.
*H01L 29/78* (2006.01)
*H01L 21/8234* (2006.01)
*H01L 29/66* (2006.01)
*H01L 27/088* (2006.01)

(52) U.S. Cl.
CPC .. *H01L 29/7827* (2013.01); *H01L 21/823487* (2013.01); *H01L 27/088* (2013.01); *H01L 29/66666* (2013.01)

(58) Field of Classification Search
CPC combination set(s) only.
See application file for complete search history.

(56) References Cited

U.S. PATENT DOCUMENTS

| | | |
|---|---|---|
| 6,137,129 A | 10/2000 | Bertin et al. |
| 6,759,699 B1 | 7/2004 | Chi |
| 7,138,685 B2 | 11/2006 | Hsu et al. |
| 7,678,658 B2 | 3/2010 | Yang et al. |
| 8,035,170 B2 | 10/2011 | Inaba |
| 8,169,030 B2 | 5/2012 | Masuoka et al. |
| 8,373,235 B2 * | 2/2013 | Masuoka ............ H01L 29/1083 257/368 |
| 8,409,948 B2 | 4/2013 | Fischer et al. |

(Continued)

OTHER PUBLICATIONS

A.Veloso, et al.,"Challenges and Opportunities of Vertical FET Devices using 3D Circuit Design Layouts", IEEE, 2016, p. 1-3.

(Continued)

*Primary Examiner* — Nduka E Ojeh
(74) *Attorney, Agent, or Firm* — Cantor Colburn LLP; Douglas Pearson

(57) ABSTRACT

According to an embodiment of the present invention, a semiconductor device includes a plurality of transistors, wherein each of the plurality of transistors includes a first vertical fin connected to a gate and a first doped region, wherein the first doped region is formed on a substrate, a second vertical fin connected to the gate and a source or a drain (S/D), wherein the S/D is formed on the substrate and a bottom contact self-aligned with and connected to the gate and a second doped region. Each of the plurality of transistors is operably connected to form the semiconductor device.

20 Claims, 17 Drawing Sheets

(56) References Cited

U.S. PATENT DOCUMENTS

| | | | |
|---|---|---|---|
| 8,692,317 B2 | 4/2014 | Takeuchi | |
| 8,853,700 B2 | 10/2014 | Sardesai et al. | |
| 9,362,292 B1 | 6/2016 | Liaw | |
| 9,530,866 B1* | 12/2016 | Zhang | H01L 29/0676 |
| 10,079,229 B1 | 9/2018 | Bi et al. | |
| 10,083,971 B1* | 9/2018 | Zang | H01L 29/7827 |
| 10,163,915 B1 | 12/2018 | Zang et al. | |
| 2008/0274600 A1 | 11/2008 | Mathew et al. | |
| 2011/0062523 A1* | 3/2011 | Masuoka | H01L 21/823885 |
| | | | 257/368 |
| 2015/0179655 A1 | 6/2015 | Nakanishi et al. | |
| 2015/0318288 A1 | 11/2015 | Lim et al. | |
| 2015/0318289 A1 | 11/2015 | Liaw | |
| 2016/0078922 A1* | 3/2016 | Liaw | H01L 27/1104 |
| | | | 365/51 |
| 2017/0005101 A1* | 1/2017 | Anderson | H01L 21/28008 |
| 2017/0179116 A1 | 6/2017 | Anderson et al. | |
| 2017/0345897 A1 | 11/2017 | Kang et al. | |
| 2018/0174642 A1* | 6/2018 | Huynh Bao | H01L 29/42392 |
| 2018/0330997 A1 | 11/2018 | Ryckaert et al. | |
| 2019/0363176 A1 | 11/2019 | More et al. | |
| 2020/0006353 A1 | 1/2020 | Anderson et al. | |
| 2020/0006552 A1 | 1/2020 | Anderson et al. | |
| 2020/0105769 A1 | 4/2020 | Anderson et al. | |
| 2020/0235092 A1 | 7/2020 | Lilak et al. | |

OTHER PUBLICATIONS

Anderson et al., "Vertical Transistor Contact for a Memory Cell With Increased Density," U.S. Appl. No. 16/699,980, filed Dec. 2, 2019.

List of IBM Patents or Patent Applications Treated as Related; Date Filed: Jan. 20, 2020, 2 pages.

Trong Huynh-Bao, et al.,"Toward the 5nm Technology: Layout Optimization and Performance Benchmark for Logic/SRAMs Using Lateral and Vertical GAA FETs", Proc. of SPIE vol. 9781, 2016, p. 1-12.

* cited by examiner

VERTICAL TRANSISTOR CONTACT FOR CROSS-COUPLING IN A MEMORY CELL

DOMESTIC PRIORITY

This application is a continuation of U.S. patent application Ser. No. 16/023,421, filed Jun. 29, 2018, the disclosure of which is incorporated by reference herein in its entirety.

BACKGROUND

The present invention generally relates to fabrication methods and resulting structures for semiconductor devices. More specifically, the present invention relates to fabrication methods and resulting structures for vertical transistors, wherein the contacts of the vertical transistor are configured and arranged to provide cross-coupling in a memory cell.

The metal oxide semiconductor field effect transistor (MOSFET) is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

A type of MOSFET is a non-planar FET known generally as a vertical field effect transistor (VFET). VFETs employ semiconductor fins and side-gates that can be contacted outside the active region, resulting in increased device density and some increased performance over lateral devices. In VFETs, the source to drain current flows in a direction that is perpendicular to a major surface of the substrate. For example, in a known VFET configuration, a major substrate surface is horizontal, and a vertical fin extends upward from the substrate surface. The fin forms the channel region of the transistor. A source region and a drain region are situated in electrical contact with the top and bottom ends of the channel region, while a gate is disposed on one or more of the fin sidewalls.

SUMMARY

According to an embodiment of the present invention, a semiconductor device includes a plurality of transistors, wherein each of the plurality of transistors includes a first vertical fin connected to a gate and a first doped region, wherein the first doped region is formed on a substrate, a second vertical fin connected to the gate and a source or a drain (S/D), wherein the S/D is formed on the substrate and a bottom contact self-aligned with and connected to the gate and a second doped region. Each of the plurality of transistors is operably connected to form the semiconductor device.

According to another embodiment of the present invention, a semiconductor device includes a plurality of transistors, wherein each of the plurality of transistors includes a first vertical fin connected to a gate and a first doped region, wherein the first doped region is formed on a substrate, a second vertical fin connected to the gate and a source or a drain (S/D), wherein the S/D is formed on the substrate and a buried bottom contact self-aligned with and connected to the gate and a second doped region. Each of the plurality of transistors is operably connected to form the semiconductor device.

According to an embodiment of the present invention, a semiconductor device includes a plurality of transistors, wherein each of the plurality of transistors includes a first vertical fin connected to a gate and a first doped region, wherein the first doped region is formed on a substrate, a second vertical fin connected to the gate and a source or a drain (S/D), wherein the S/D is formed on the substrate and a buried bottom contact self-aligned with and connected to the gate and connected to the first doped region and a second doped region. Each of the plurality of transistors is operably connected to form the semiconductor device.

Figure 1:
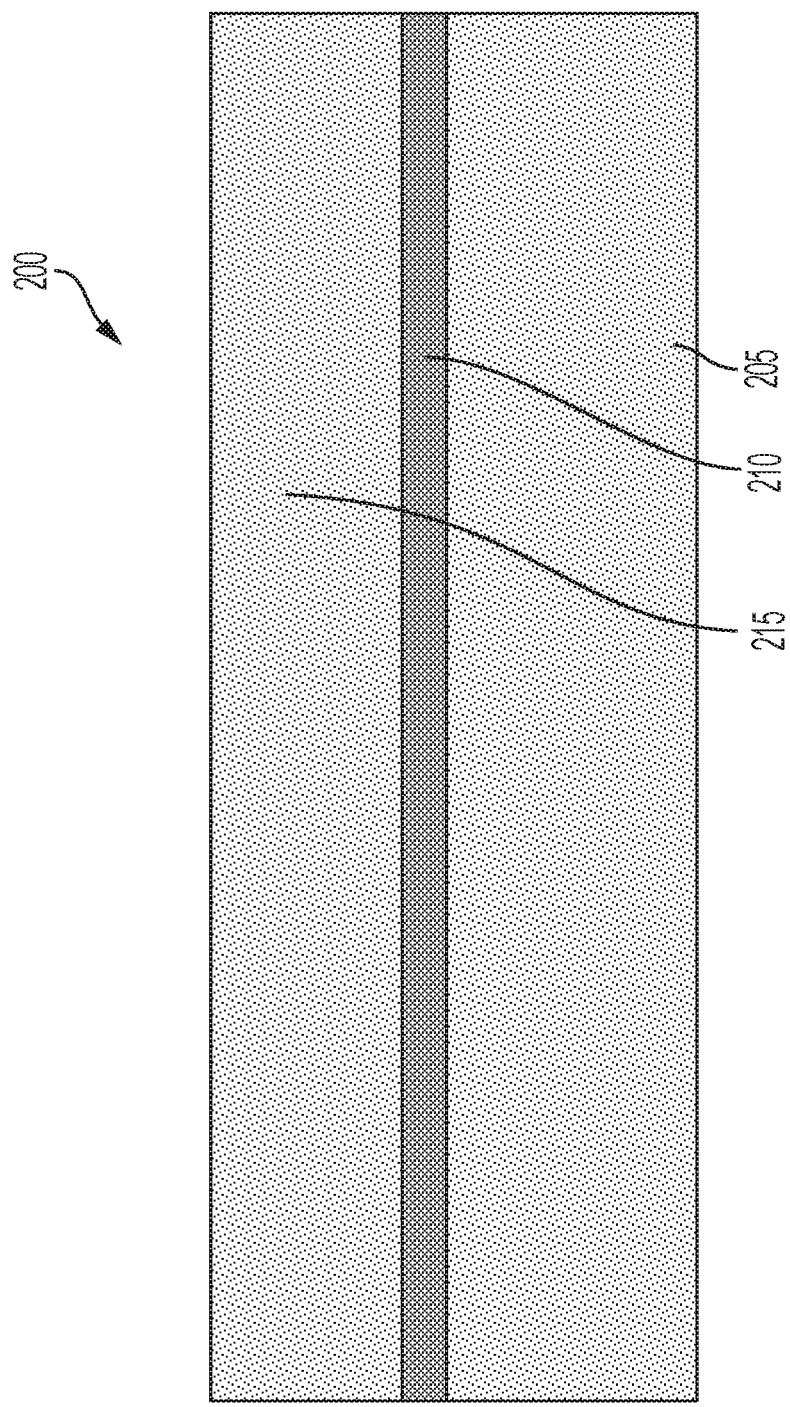
FIG. 1 is a cross-sectional view of a structure that results from performing initial fabrication operations according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of one or more embodiments of the present invention are unique. Thus, the unique combination of the operations described in connection with the fabrication of a semiconductor device utilizing a non-selective low temperature deposition process for forming the top S/D in a VFET device followed by a low temperature oxidation process to form the non-uniform top spacer according to one or more embodiments of the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

Turning now to an overview of technologies that are more specifically relevant to aspects of the invention, vertical field effect transistor (FET) devices provide opportunities to increase device density on a wafer. Vertical FET devices have a source/drain (S/D) region arranged on a substrate. The channel region is arranged vertically above the substrate such that the gate stack can wrap around the channel region.

VFET devices have been a promising candidate for designing next generation SRAM memory. Static Random Access Memory (Static RAM or SRAM) is a type of RAM that holds data in a static form, that is, as long as the memory has power. A typical SRAM has address lines, data lines, and control lines. The address lines are used to identify the location of the memory storage element(s) or cell(s) to be read from or written to. The data lines contain the value of the data read or being written into the memory cells accessed. The control lines are used to direct the sequence of steps needed for the read or write operations of the SRAM.

SRAM circuits typically use 4 to 6 transistors. The transistors are designed to form cross-coupled inverters that can hold a '1' or '0' state as long as the circuit has power. A pair of cross-coupled inverters have the output of one inverter going into the input of the other and vice versa, such that the output (and input) of one inverter is the complement of that of the other.

In SRAM design, cross-coupling is employed in which an electrical connection from a gate to a S/D is needed. Cross-coupling can be accomplished using a lithography process; however, variations in placement/layout can exist, for example, lithography overlay and line edge roughness (LER), which can cause connection and/or component overlap. The overlap of connections and/or components can cause circuit failures (e.g., short circuits).

In addition, forming a bottom contact (BC) to connect a cross-couple gate to a bottom S/D also employs a lithography process. However, the lithography process to create the BC does not self-align the BC to the gate. Having a BC that is not self-aligned to the gate can be problematic from an area perspective due to the fact that space in a VFET SRAM cell is limited (i.e., a tight cell) and having a misaligned BC in a tight cell can cause circuit failures.

Turning now to an overview of the aspects of the invention, one or more embodiments of the invention address the above-described shortcomings of the prior art by providing a VFET SRAM circuit design that can account for lithography variations. A VFET SRAM design according to aspects of the invention employs a cross-coupling scheme that accounts for the above-described variations by utilizing a self-aligned BC. Accordingly, the proposed SRAM VFET design can account for a limited design area in a tight cell.

The above-described aspects of the invention address the shortcomings of the prior art by implementing a self-aligned BC scheme that forms a BC that is self-aligned to a gate. Having a self-aligned BC prevents circuit failures due to the BC overlapping another component or connection of the VFET SRAM cell. Various self-aligned BC designs can be employed based on designer goals or limitations. For example, designs can be predicated on a desired BC height and/or whether a bottom silicide will be used.

According to one or more embodiments, it should be appreciated that a fabrication process to build a vertical transistor, such as the VFET 100 is discussed below with reference to intermediate structures 200 shown in FIGS. 1-17. The intermediate structures show the structure that results from performing the described fabrication operations.

In FIG. 1, known fabrication operations have been used to fabricate a structure 200 according to one or more embodiments of the invention. The intermediate structure 200 includes a substrate 205. The substrate 205 can be any suitable substrate material, such as, for example, any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as substrate 205. In one or more embodiments of the present invention, when substrate 205 is a remaining semiconductor material portion of a bulk semiconductor substrate, the substrate 205 can be of a single crystalline semiconductor material, such as, for example, single crystalline silicon. In some embodiments, the crystal orientation of the remaining semiconductor portion of the bulk semiconductor substrate can be {100}, {110}, {111} or any other of the well-known crystallographic orientations. As will be described in greater detail below, each semiconductor fin can include the same semiconductor material, or a different semiconductor material, from substrate 205.

In other embodiments, substrate 205 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate can be a non-semiconductor material including, for example, a dielectric material and/or a conductive material. In yet other embodiments, the handle substrate can be omitted and the substrate 205 includes only an insulator layer.

In one or more embodiments, the handle substrate and the semiconductor layer can have the same or different crystal orientation. For example, the crystal orientation of the handle substrate and/or the semiconductor layer can be {100}, {110}, or {111}. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate and that can be employed as substrate 205 can be a crystalline or non-crystalline oxide and/or nitride. In one or more embodiments, the insulator layer can bean oxide such as, for example, silicon dioxide. In some embodiments, the insulator layer can be a nitride such as, for example, silicon nitride or boron nitride. In yet other embodiments, the insulator layer can be a multilayered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from 10 nm to 100 nm. Other thicknesses that are lesser than, or greater than, the aforementioned thickness range can also be used as the thickness of the semiconductor layer of the SOI substrate. The insulator layer of the SOI substrate can have a thickness from 1 nm to 200 nm. Other thicknesses that are lesser than, or greater than, the aforementioned thickness range can also be employed as the insulator layer.

A doped layer 210 is formed on top of the substrate 205. The doped layer 210 can be an epitaxy. The doped epitaxial layer 210 can be doped N+ for building nFET (n-type) or doped P+ for building pFET (p-type) structures. The doped epitaxial layer 210 can be patterned as desired. The doped epitaxial layer 210 results in the bottom S/D as seen below.

The doped epitaxial layer 210 can be formed by epitaxial growth and/or deposition. As used herein, the terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In one or more embodiments, the gas source for the deposition of epitaxial semiconductor material can include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. The particular epitaxial region is not intended to be limited and will generally depend on the type of VFET being formed.

The epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 500° C. to 900° C.

A channel layer 215 can be formed on top of the doped layer 210. The channel layer 215 can be non-doped. The channel layer 215 can be Si, SiGe, and/or any group III-V semiconductor material.

Figure 2:
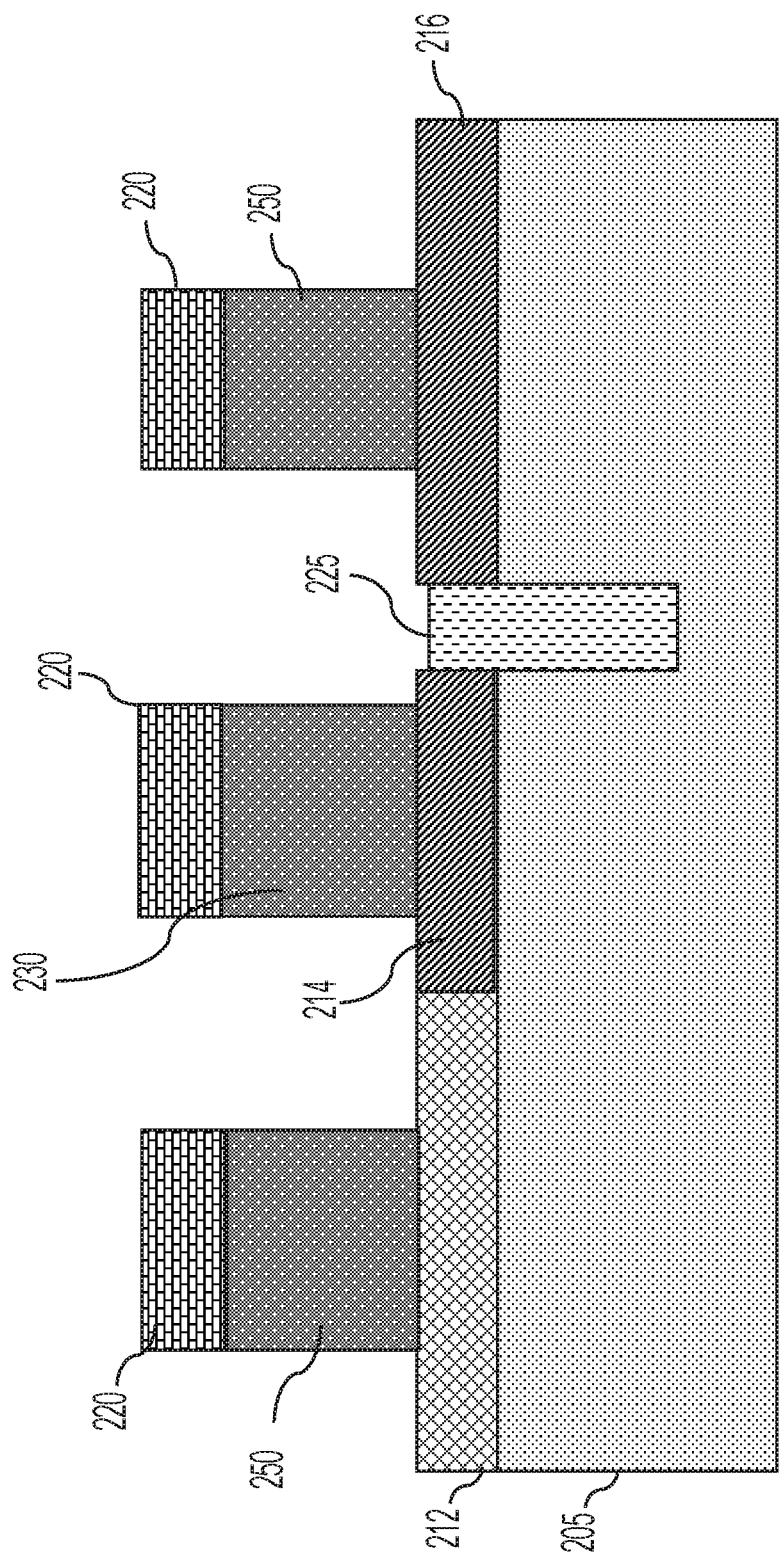
FIG. 2 is a cross-sectional view of the structure after formation of one or more fins according to one or more embodiments of the present invention.

FIG. 2 is a cross-sectional view of the intermediate structure 200 after formation of one or more fins according to one or more embodiments. The channel layer 215 can be formed into vertical fins 250 extending in the z-axis. Additionally, a dummy vertical fin 230 can be formed in a manner similar to the formation of vertical fins 250. A hard mask 220 can be formed on top of the vertical fins 250. In one implementation, the hard mask 220 can be formed on the channel layer 215, and the hard mask 220 can be patterned according to the desired width of the fins 250. The pattern of the hard mask 220 can be etched through the channel layer to form the vertical fins 215. In an implementation, the hard mask 220 can be a nitride, such as, SiN.

Also, shallow trench isolation (STI) 225 areas are formed in the substrate 205 on opposite sides of the fins 215. The shallow trench isolation 225 can be formed using standard lithography processes. Forming the shallow trench isolation 225 can include etching a pattern of trenches through the doped layer 210 (illustrated as N+ region 212, P+ region 214 and P+ region 216 (i.e., the bottom S/D) into the substrate 205, depositing one or more dielectric materials (such as silicon dioxide) to fill the trenches, and removing the excess dielectric.

Figure 3:
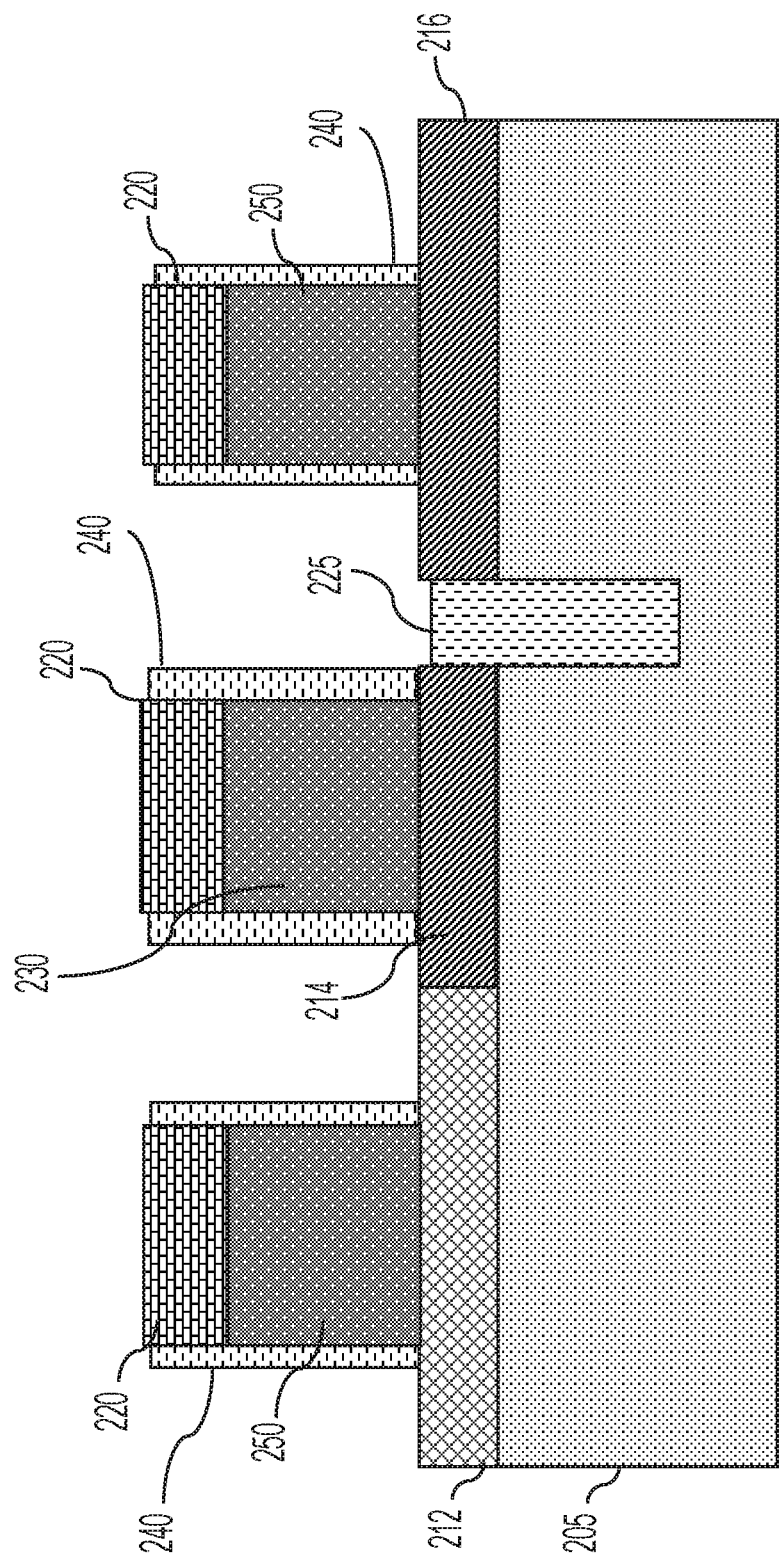
FIG. 3 is a cross-sectional view of the structure after sacrificial spacer formation according to one or more embodiments of the present invention.

FIG. 3 is a cross-sectional view of the structure 200 after sacrificial spacer formation according to one or more embodiments of the present invention. Spacer layer 240 can be directionally deposited onto the N+ region 212, P+ region 214 and P+ region 216 and along vertical fins 250, dummy vertical fin 230 and hard mask 220. The spacer layer 240 can be deposited by any non-conformal deposition methods that provides a faster deposition rate on the planar surface and slower deposition rate on the sidewall surface including but not limited to plasma vapor deposition (PVD), high density plasma (HDP) deposition or the like. After directional deposition of spacer layer 240, an etch-back process can be performed to remove the any residue of spacer materials from the fin sidewall. In PVD, a pure source material is gasified via evaporation, the application of high power electricity, laser ablation, or the like. The gasified material will then condense on the substrate material to create the desired layer. In one or more embodiments, the spacer layer 240 can be a low k dielectric material. Exemplary low k dielectric materials include, but are not limited to, dielectric oxynitrides (e.g., SiOCN) or any other suitable oxide.

In some exemplary embodiments, the spacer layer 240 can include a material that is resistant to some etching processes such as, for example, HF chemical etching or chemical oxide removal etching. In one or more embodiments, the spacer layer 240 can have a thickness in the range of about 3 nm to about 10 nm, or in the range of about 4 nm to about 6 nm.

Figure 4:
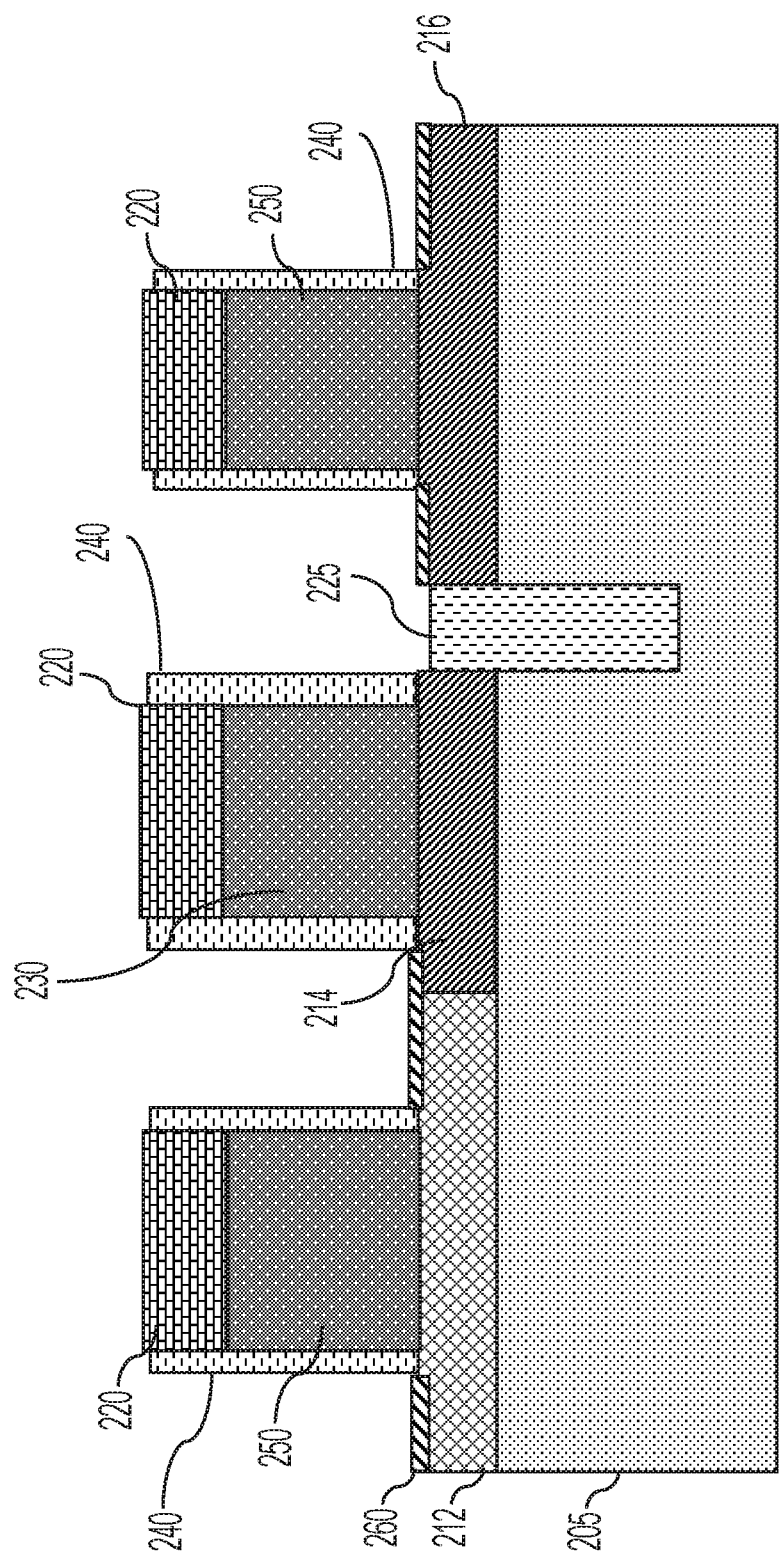
FIG. 4 is a cross-sectional view of the structure after bottom silicide formation according to one or more embodiments of the present invention.

FIG. 4 is a cross-sectional view of the structure 200 after bottom silicide formation according to one or more embodiments of the present invention. A bottom silicide layer 260 can be formed on portions of the N+ region 212, P+ region 214 and P+ region 216. The silicide layer 260 can be a silicide material (e.g., WSi2, TiSi2, NiSi and CoSi2). The bottom silicide layer 260 can be deposited by a suitable deposition process, for example, chemical vapor deposition (CVD), atomic layer deposition (ALD), or physical vapor deposition (PVD).

Figure 5:
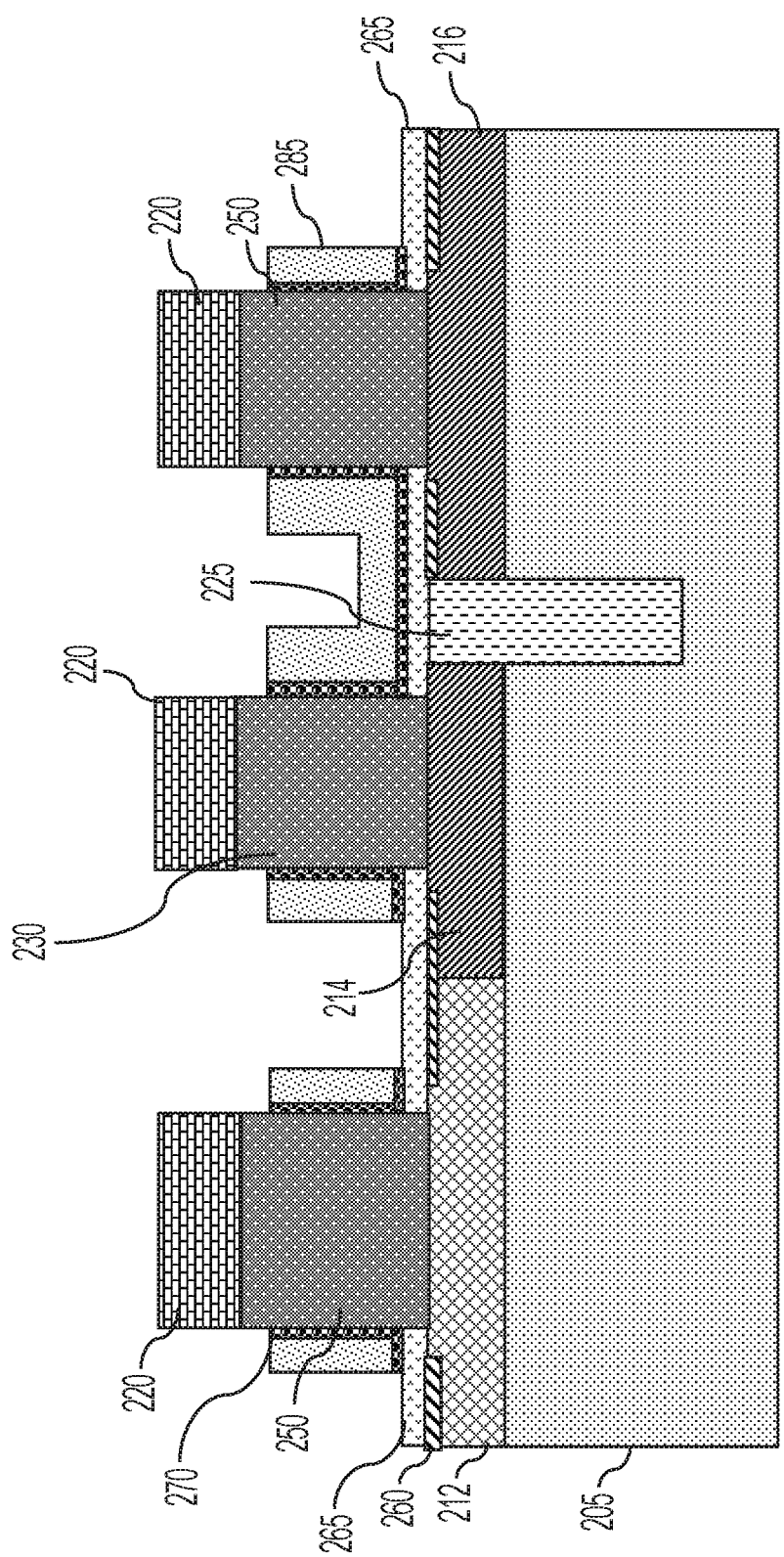
FIG. 5 is a cross-sectional view of the structure after the removal of the spacer layer, as well as after the formation of a bottom spacer, dielectric layer and metal gate according to one or more embodiments of the present invention.

FIG. 5 is a cross-sectional view of the structure 200 after the removal of the spacer layer, as well as the formation of a bottom spacer, dielectric layer and metal gate according to one or more embodiments of the present invention. Spacer layer 240 can be removed using any suitable etching process.

A bottom spacer layer 265 can be directionally deposited onto N+ region 212, P+ region 214, P+ region 216 and silicide layer 260. The bottom spacer layer 265 can be deposited by any non-conformal deposition methods that provides a faster deposition rate on the planar surface and slower deposition rate on the sidewall surface including but not limited to plasma vapor deposition (PVD), high density plasma (HDP) deposition or the like. After directional deposition of bottom spacer, an etch-back process is performed to remove the any residue of spacer materials from the fin sidewall. In PVD, a pure source material is gasified via evaporation, the application of high power electricity, laser ablation, or the like. The gasified material will then condense on the substrate material to create the desired layer. In one or more embodiments, the bottom spacer 265 can be a low k dielectric material. The term "low k dielectric" generally refers to an insulating material having a dielectric constant less than silicon nitride, i.e., less than 7.0. Exemplary low k dielectric materials include, but are not limited to, dielectric nitrides (e.g., silicon nitride, SiBCN), dielectric oxynitrides (e.g., SiOCN), or any combination thereof or the like.

A high-dielectric constant (high-k) layer can be deposited as a gate dielectric 270 and followed by the formation of a metal gate 285. Gate dielectric 270 can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

Metal gate 285 can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. In some embodiments, the gate can further include a work function setting layer between the gate dielectric and gate conductor. The work function setting layer can be a work function metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Figure 6:
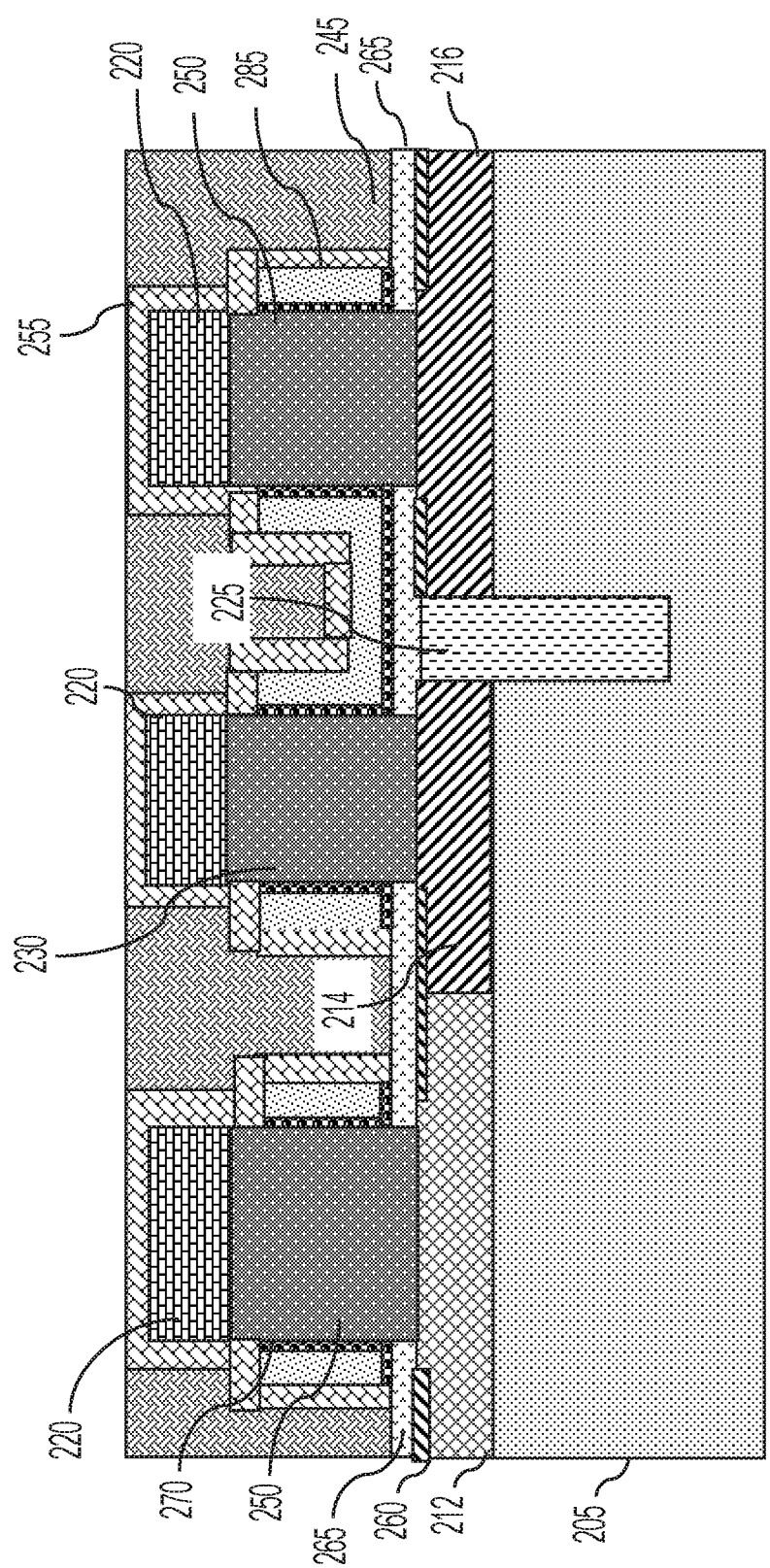
FIG. 6 is a cross-sectional view of the structure after gate encapsulation and deposition of filling material according to one or more embodiments of the present invention.

FIG. 6 is a cross-sectional view of the structure 200 after the formation of a gate encapsulation layer and deposition of filling material according to one or more embodiments of the present invention. A gate encapsulation layer 255 can be formed on the sides of the high-k material 270, metal gate 285 and hard mask 220. The gate encapsulation layer 255 can be a nitride, such as, e.g., SiN). The gate encapsulation layer 255 can be deposited by a suitable deposition process, for example, chemical vapor deposition (CVD), atomic layer deposition (ALD), or physical vapor deposition (PVD).

A filling material 245 can be formed on the bottom spacer 265 and along the gate encapsulation layer 255. Any suitable oxide can be used as filling material 255. The intermediate structure 200 can also be planarized using, for example, CMP.

Figure 7:
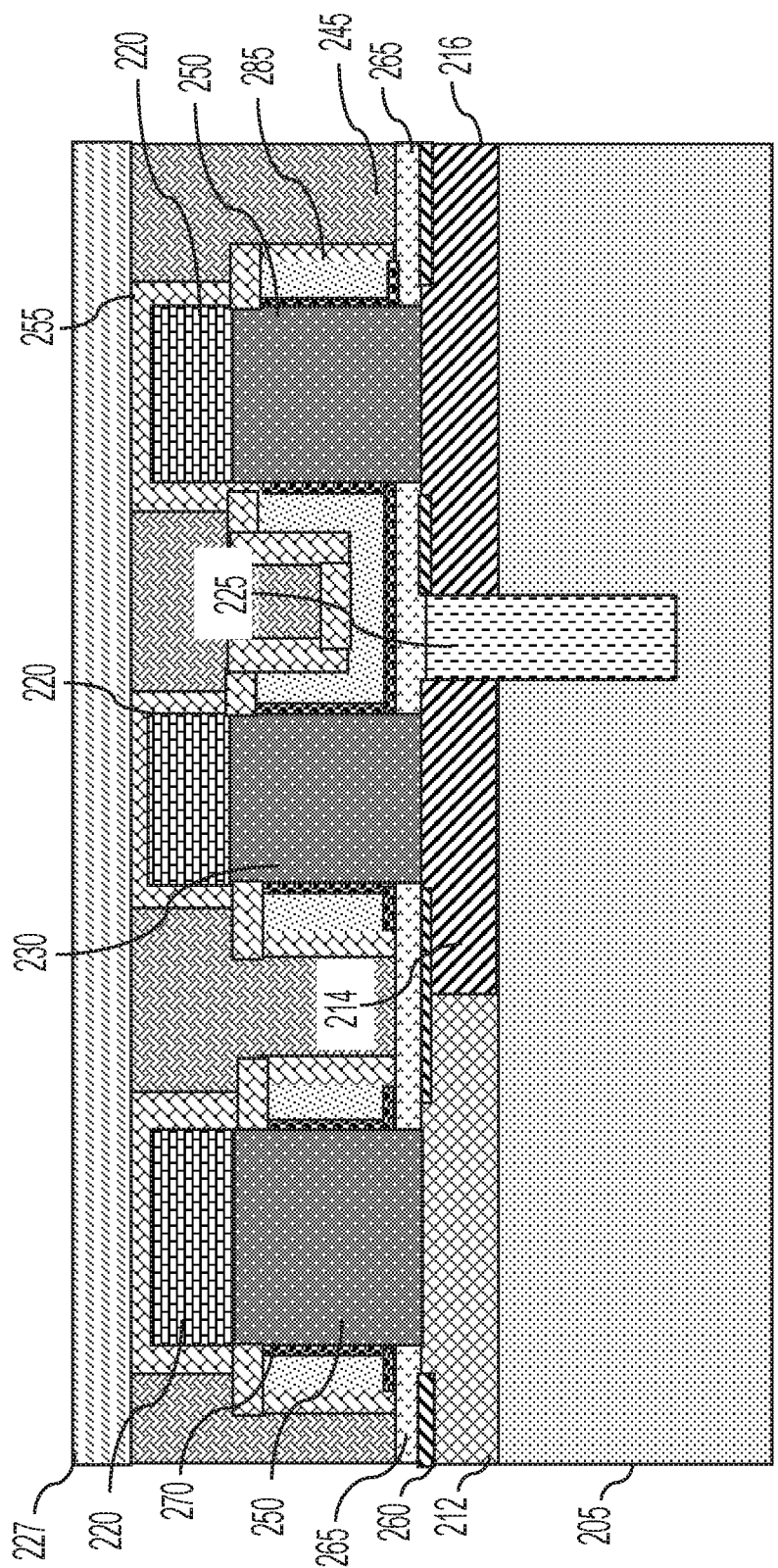
FIG. 7 is a cross-sectional view of the structure after deposition of an interlayer dielectric (ILD) according to one or more embodiments of the present invention.

FIG. 7 is a cross-sectional view of the structure 200 after deposition of an interlayer dielectric (ILD) 227 according to one or more embodiments of the present invention. ILD 227 can be deposited on filling material 245 and gate encapsulation layer 255 of the intermediate structure 200. By way of example, the ILD 227 can include any dielectric material including inorganic dielectrics or organic dielectrics. Some examples of suitable dielectrics that can be used as the dielectric material include, but are not limited to: silicon oxide, silsequioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD 227 can be deposited by spin on processes, PECVD processes or the like as is generally known in the art.

Figure 8:
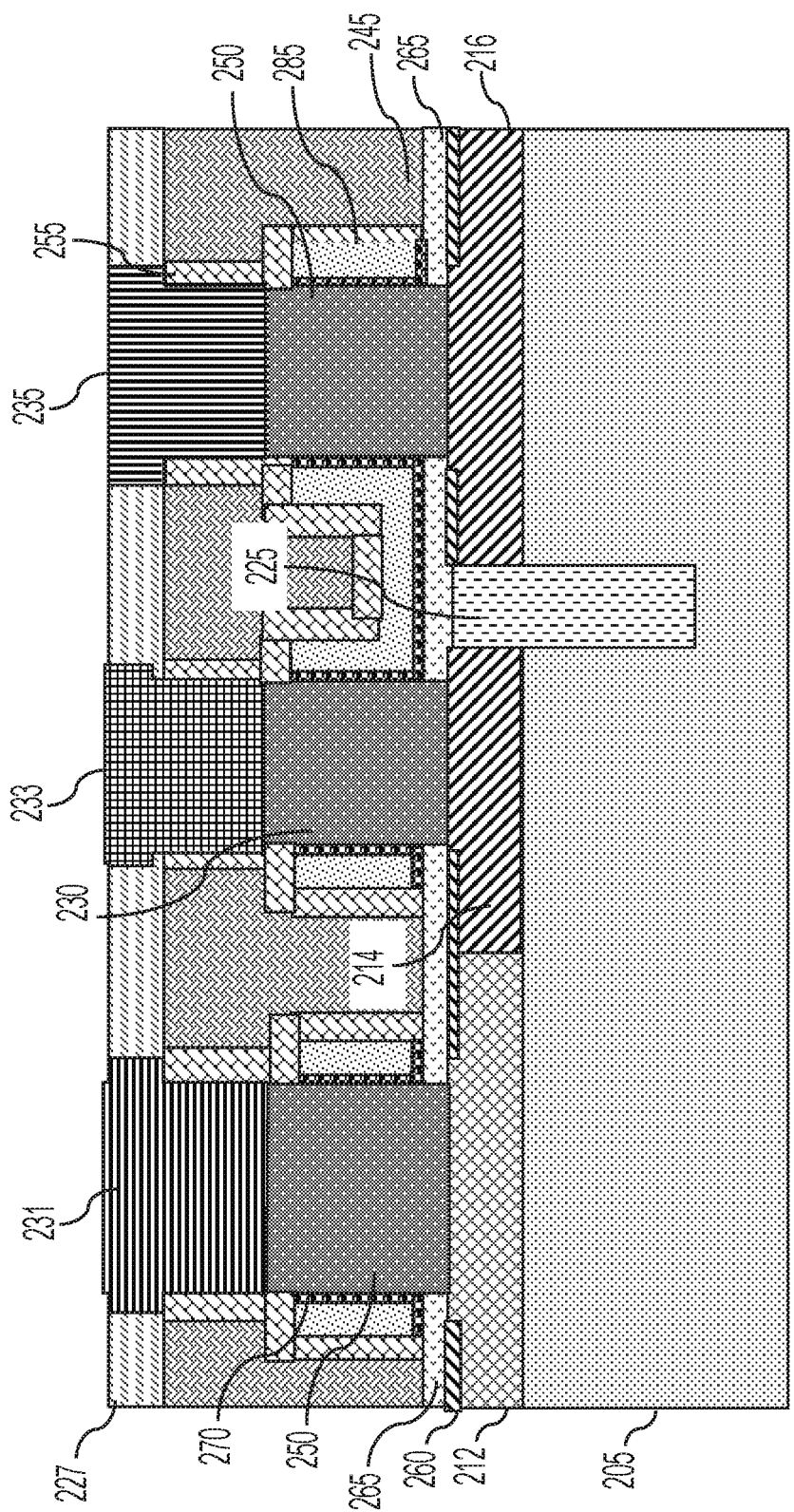
FIG. 8 is a cross-sectional view of the structure after the removal of the mask to form a trench and epitaxial growth in the trench according to one or more embodiments of the present invention.

FIG. 8 is a cross-sectional view of the structure 200 after the removal of the mask 220 to form a trench and an epitaxial growth in the trench according to one or more embodiments of the present invention. The trench can extend a top of each fin 250 and 230 and from the sidewall of the gate encapsulation layer 255. Epitaxial top S/Ds 231, 233 and 235 can be formed by the growth of the epitaxy associated with each of the fins 250 and 230 using a low temperature deposition process.

For an nFET, the epitaxial top S/D 231 can be doped with an n-type dopant, such as, e.g., As or P, and the epitaxial layer can be Si, SiC, etc. For a pFET, the epitaxial top S/Ds 233 and 235 can be doped with a p-type dopant, such as, e.g., B, and the epitaxial layer can be SiGe, Si, etc.

Epitaxial materials can be grown from gaseous or liquid precursors. Epitaxial materials can be grown using vapor-phase epitaxy (VPE), molecular-beam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable process. Epitaxial silicon, silicon germanium (SiGe), germanium (Ge), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the S/D can range from about $1\times10^{19}$ cm$^{-3}$ to about $3\times10^{21}$ cm$^{-3}$, or in one or more other embodiments, can be in a range from about $2\times10^{20}$ cm$^{-3}$ and about $3\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 9:
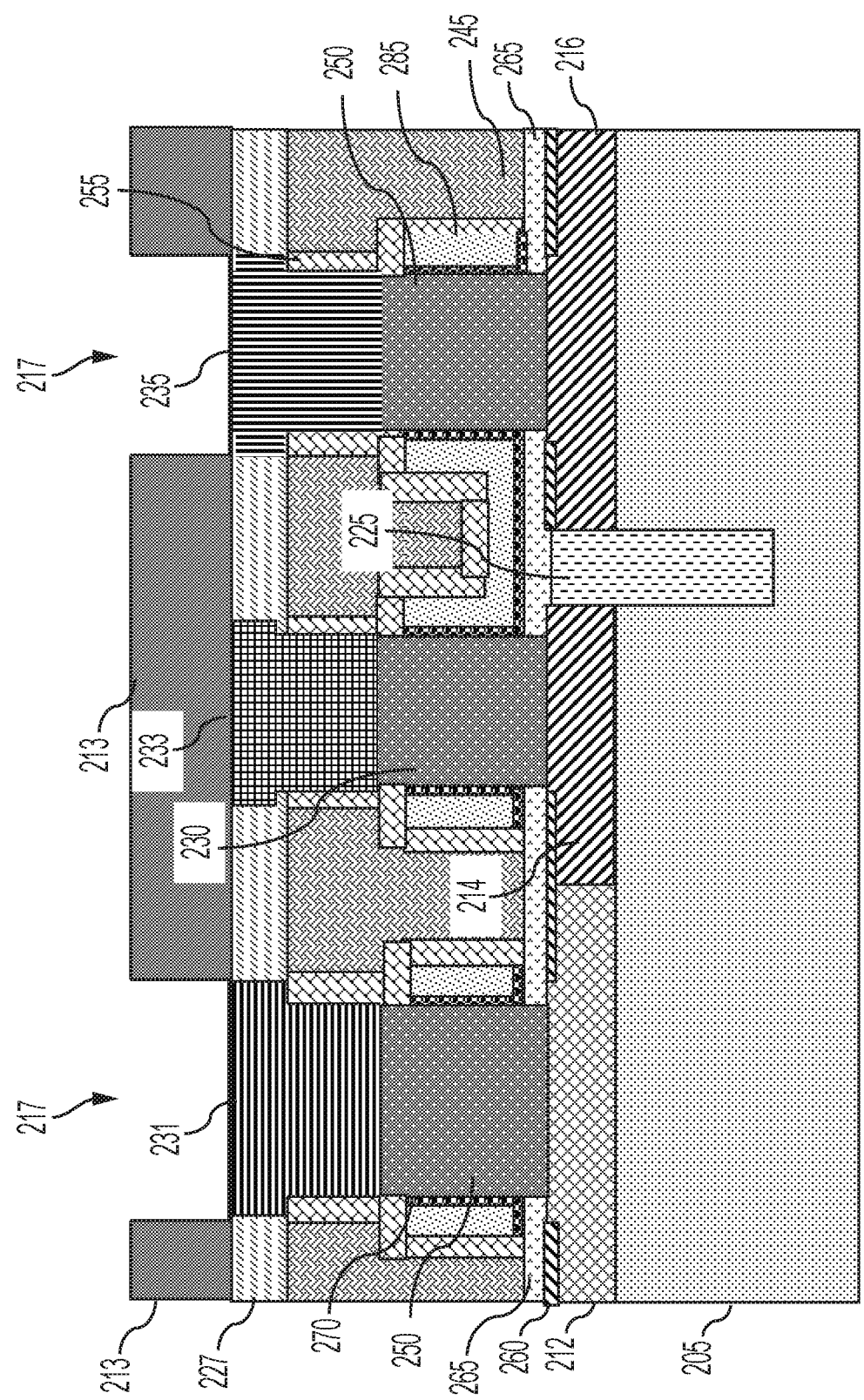
FIG. 9 is a cross-sectional view of the structure after deposition of a middle of the line (MOL) ILD and creation of void locations for the creation of a contact according to one or more embodiments of the present invention.

FIG. 9 is a cross-sectional view of the structure 200 after deposition of a middle of the line (MOL) ILD 213 and creation of void locations 217 for the creation of a contact according to one or more embodiments. The MOL ILD 213 can be deposited over filling material 245, gate encapsulation layer 255 and top S/Ds 231, 233 and 235. By way of example, the MOL ILD 213 can include any dielectric material including inorganic dielectrics or organic dielectrics. Some examples of suitable dielectrics that can be used as the dielectric material include, but are not limited to: silicon oxide, silsequioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The MOL ILD 213 can be deposited by spin on processes, PECVD processes or the like as is generally known in the art. Void locations 217 can be formed using any suitable process to etch-back portions of the MOL ILD 213. For example, an etching process such as, a chemical wet or dry etching process can be used.

Figure 10:
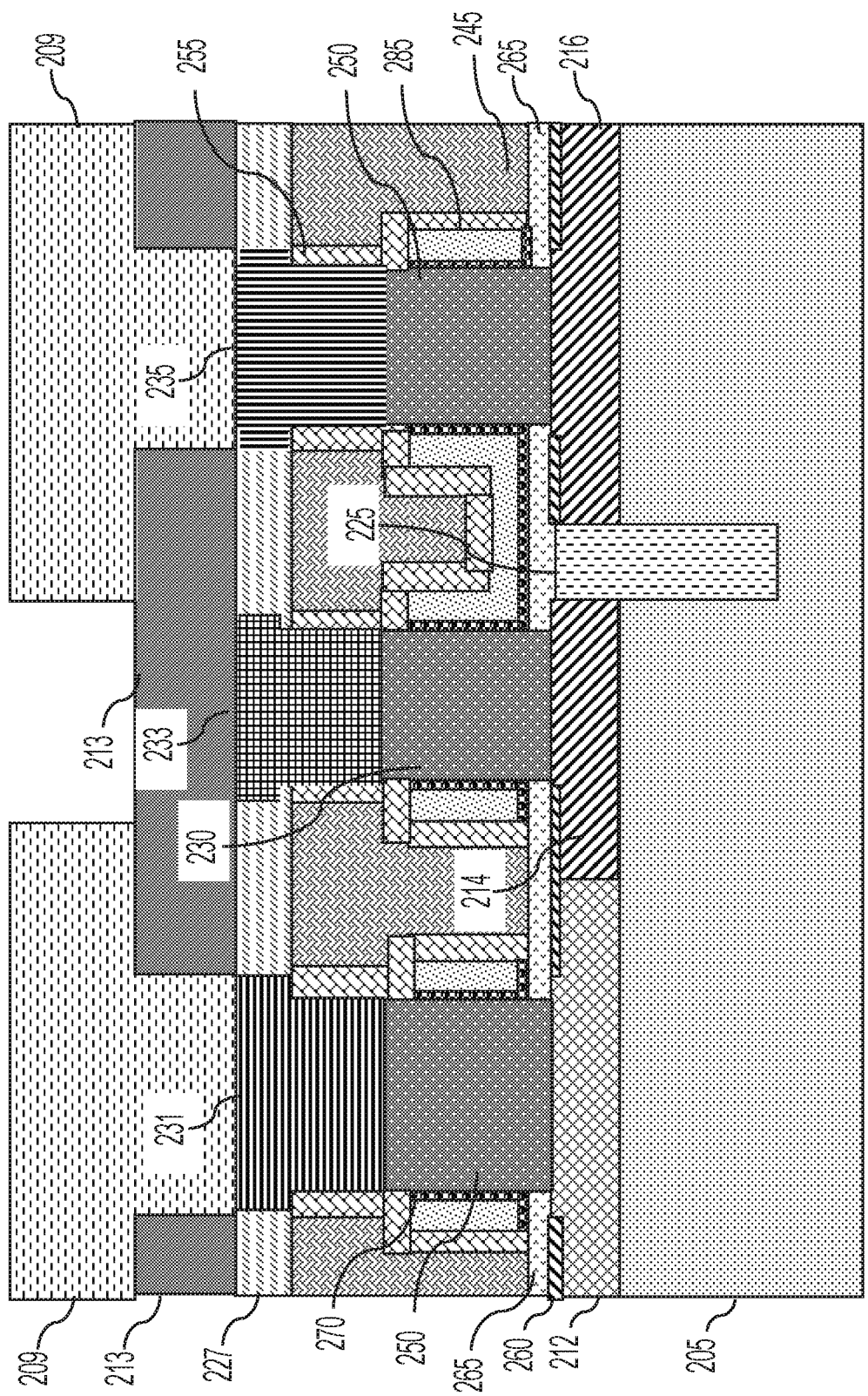
FIG. 10 is a cross-sectional view of the structure after deposition of a bottom contact (BC) mask according to one or more embodiments of the present invention.

FIG. 10 is a cross-sectional view of the structure 200 after deposition of a bottom contact (BC) mask 209 according to one or more embodiments. The BC mask 209 can be deposited within the void locations 217 and over portions of the MOL ILD 213. BC mask 209 can include, for example, a silicon nitride (SiN) hardmask. The BC mask 209 can be deposited using a deposition process, including, but not limited to, PVD, CVD, PECVD, or any combination thereof. Other mask compositions can include silicon oxides, silicon oxynitrides, silicon carbides, silicon carbonitrides, etc. Spin-on dielectrics can also be utilized as a hard mask material including, but not limited to, silsequioxanes, siloxanes, and boron phosphate silicate glass (BPSG) or the like. The BC mask 209 can have a single material or multiple materials.

Figure 11:
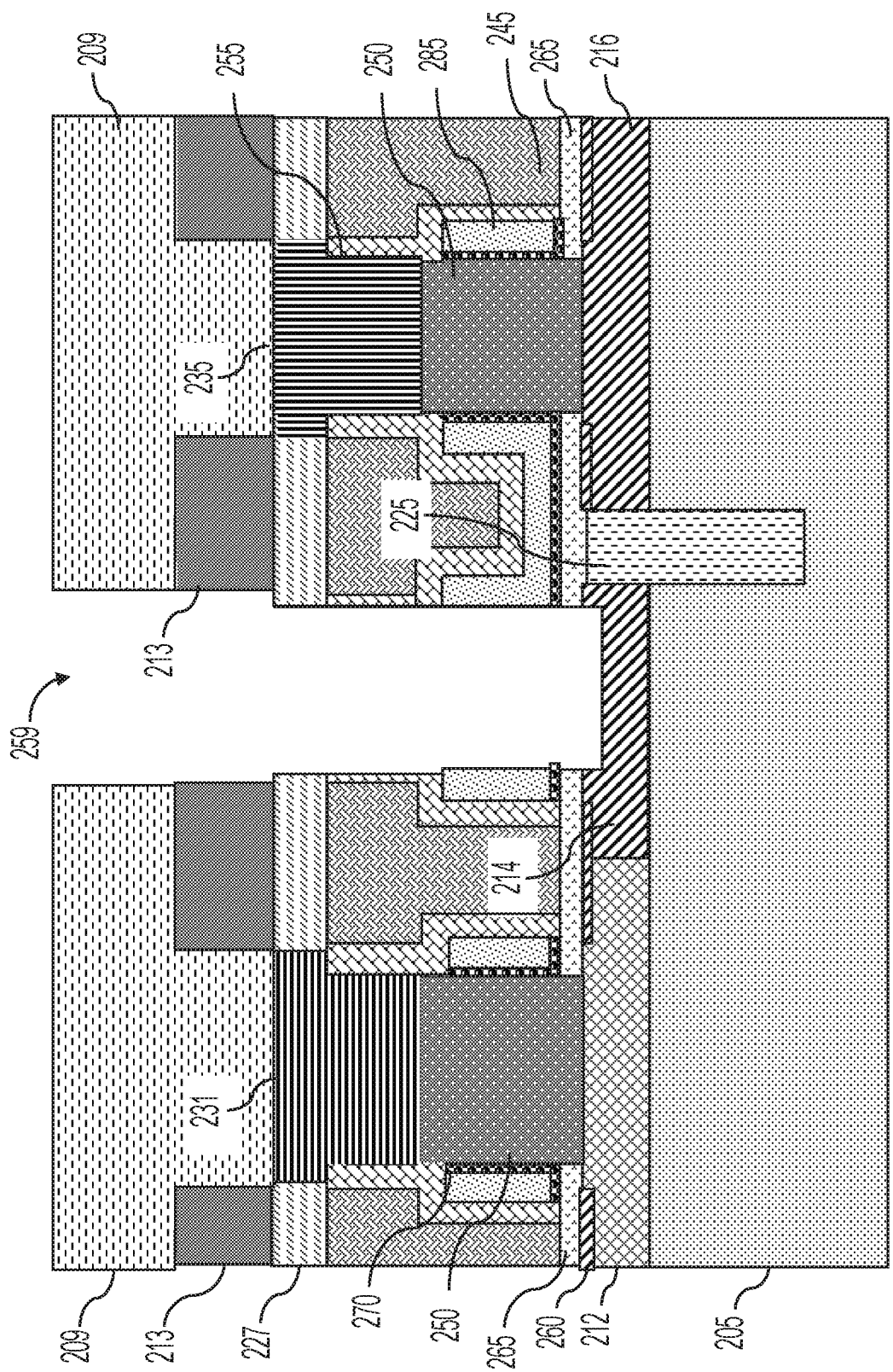
FIG. 11 is a cross-sectional view of the structure after creation of void location according to one or more embodiments of the present invention.

FIG. 11 is a cross-sectional view of the structure 200 after creation of void location 259 according to one or more embodiments. Void location 259 can be formed by removing a portion of P+ doped region 214, removing dummy gate 233, removing a portion of the gate dielectric 270, removing a portion of the gate encapsulation layer 255 and removing a portion of MOL ILD 213. Void location 259 can be created using any suitable etching process, for example, a reactive ion etching process.

Figure 12:
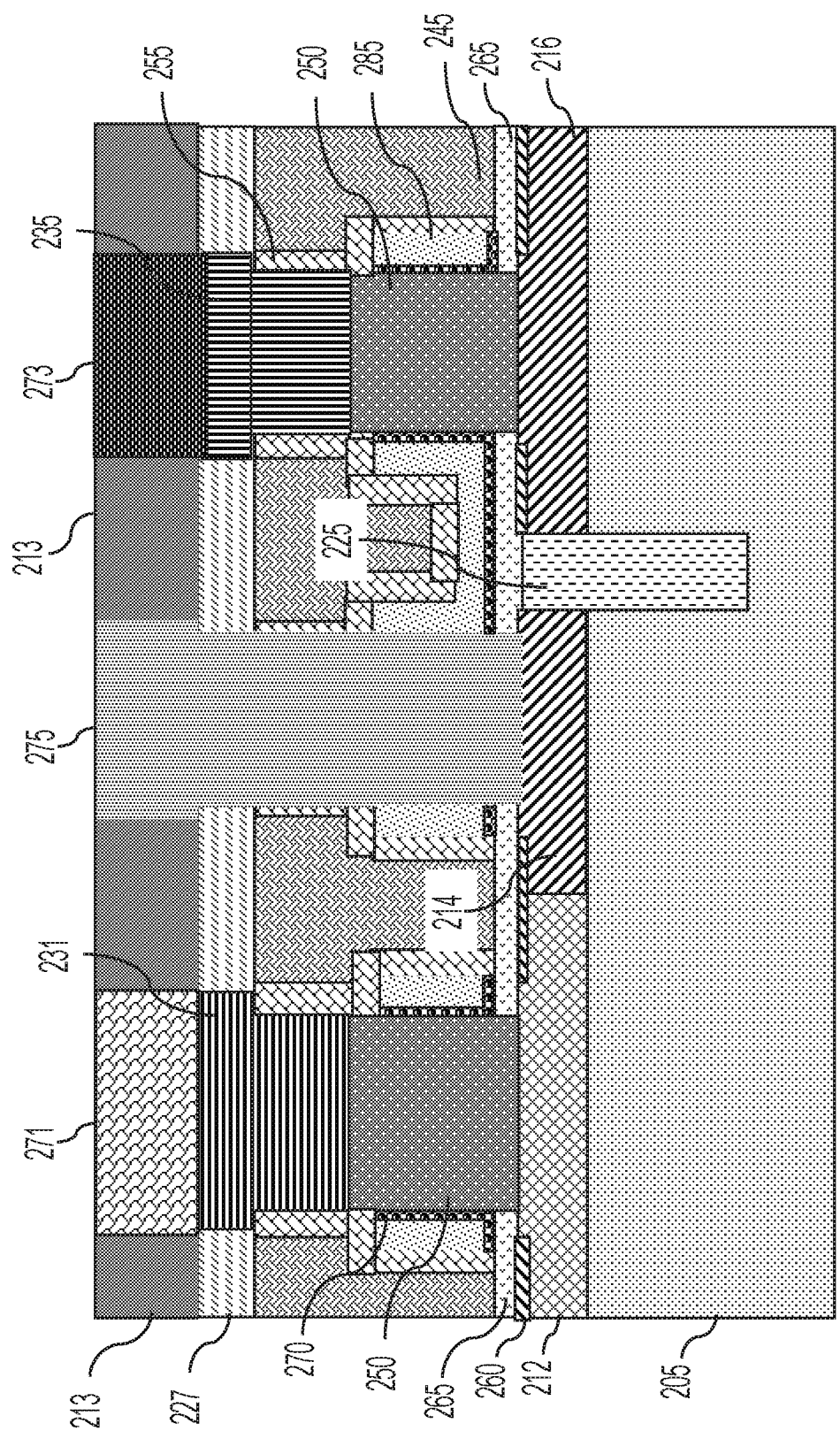
FIG. 12 is a cross-sectional view of a VFET structure that results after the removal of BC mask and formation of contacts CA, CB and BC according to one or more embodiments of the present invention.

FIG. 12 is a cross-sectional view of a VFET structure 100 that results after the removal of BC mask 209 and formation of contacts CA 271, CB 273 and bottom contact (BC) 275 according to one or more embodiments. Any suitable etching can be used to remove the BC mask 209. The removal of the BC mask 209 allows for the exposure of a top surface of the top S/Ds 231 and 235. The formation of contacts CA 271, CB 273 and BC 275 can occur during a middle of the line process to provide electrical connections between transistors.

Contacts CA 271, CB 273 and BC 275 can include any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material can further include dopants that are incorporated during or after deposition. Contacts CA 271, CB 273 and BC 275 can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

CA 271 and CB 273 can be formed atop top S/Ds 231 and 235, respectively. When forming BC 275, void location 259 can be used as a guide for aligning the BC 275. Accordingly, the BC 275 can be self-aligned to the metal gate 285.

Figure 13:
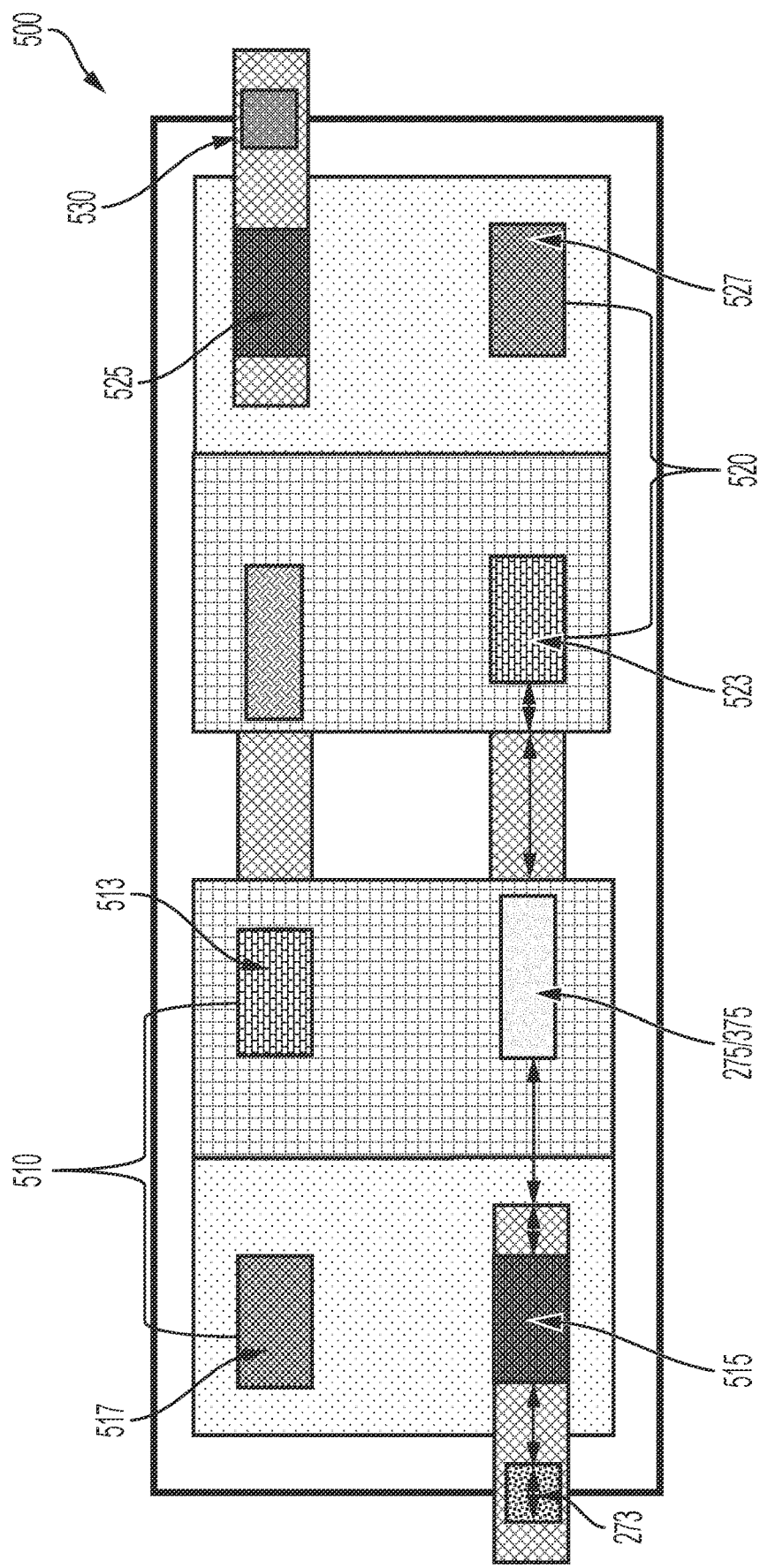
FIG. 13 is a plan view of an SRAM bit-cell layout according to one or more embodiments of the present invention.

FIG. 13 is a plan view of the SRAM bit-cell layout 500 according to one or more embodiments of the present invention. The layout 500 includes six transistors: two pairs of complementary VFET transistors (510 and 520, respectively) in which each pair includes pull-up (513 and 523, respectively) and pull-down transistors (517 and 527, respectively). The layout 500 also includes two VFET pass-gate (NFET) transistors (515 and 525, respectively). The layout 500 also includes CB 273 and BC 275, which can be self-aligned to a pass gate, for example, pass gate 515. CA 271 is not shown. Accordingly, the gate in layout 500 can be cross-coupled to a bottom S/D.

A pass gate, for example, pass gate 525, can serve as a bit line for the SRAM. The pass gate serving as the bit line can be connected to a word line node (WL) 530. Pull-down 513 can serve as a ground node (VS) and pull-up transistor 515 can serve as a voltage source node (VDD). The transistors of layout 500 can be created using a plurality of VFET structures 100.

Figure 14:
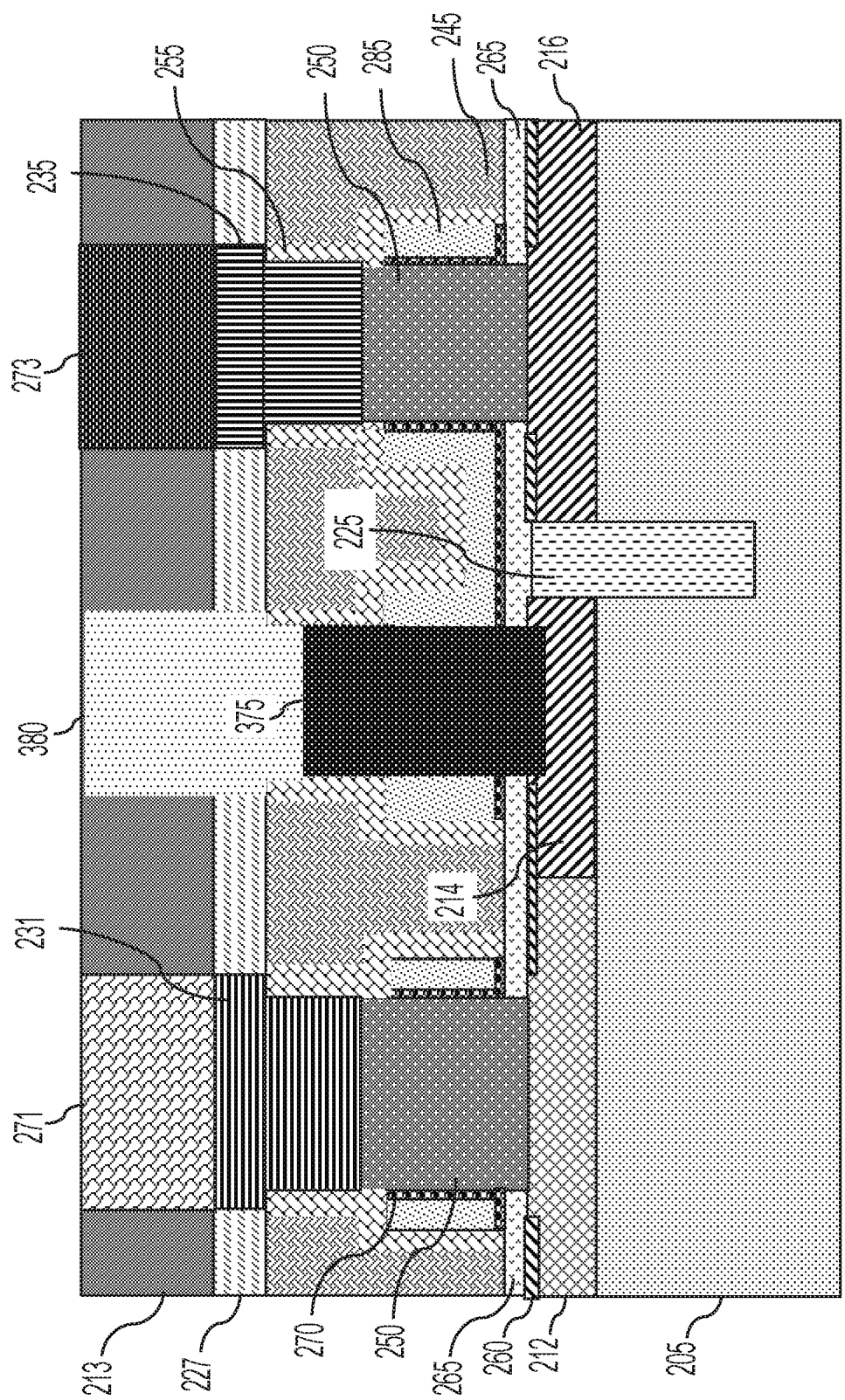
FIG. 14 is a cross-sectional view of a VFET according to one or more embodiments of the present invention which is similar to the VFET structure illustrated in FIG. 12.

While FIGS. 1-13 describe one or more embodiments for fabricating a VFET device having a self-aligned bottom contact or creating an SRAM device using a plurality of fabricated VFET devices, additional embodiments can for both aspects be considered. For example, FIG. 14 is a cross-sectional view of a VFET structure 100 according to one or more embodiments of the present invention which is similar to the VFET structure 100 illustrated in FIG. 12; however, instead of a full BC 275, BC 375 has been etched back to a height related to a top of the gate to form a buried bottom contact. Additionally, a MOL ILD 380 can be deposited over BC 375 and between contacts 271 and 273. Non-limiting examples of suitable materials for the MOL ILD 380 can include dielectric oxides (e.g., silicon oxide), dielectric nitrides (e.g., silicon nitride), dielectric oxynitrides, or any combination thereof. The VFET structure 100 of FIG. 14 can be used in SRAM layout 500 in place of the VFET structure 100 illustrated in FIG. 12.

Figure 15:
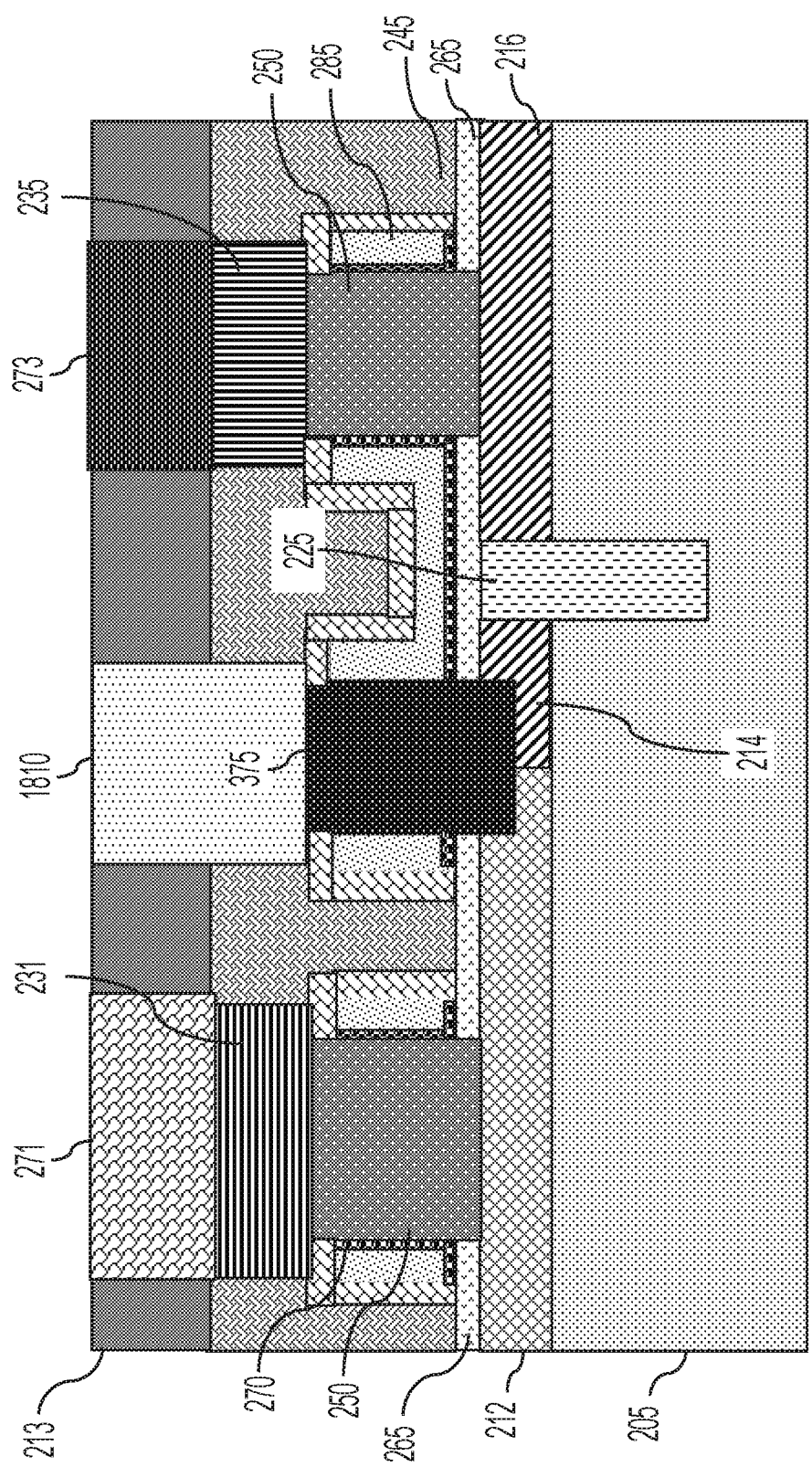
FIG. 15 is a cross-sectional view of a VFET according to one or more embodiments of the present invention which is similar to VFET structure illustrated in FIG. 14.

FIG. 15 is a cross-sectional view of a VFET structure 100 according to one or more embodiments of the present invention which is similar to VFET structure 100 of FIG. 14; however, the buried contact BC 375 contacts both the N+ doped region 212 and P+ doped region 214 material. In addition, gate encapsulation layer 255 can be etched back to expose a larger portion of the N+ doped region 231 and P+ doped region 235 material than the VFET structure 100 of FIG. 14. Also, the VFET structure 100 of FIG. 15 can operate without bottom silicide layer 260, if desired.

Figure 16:
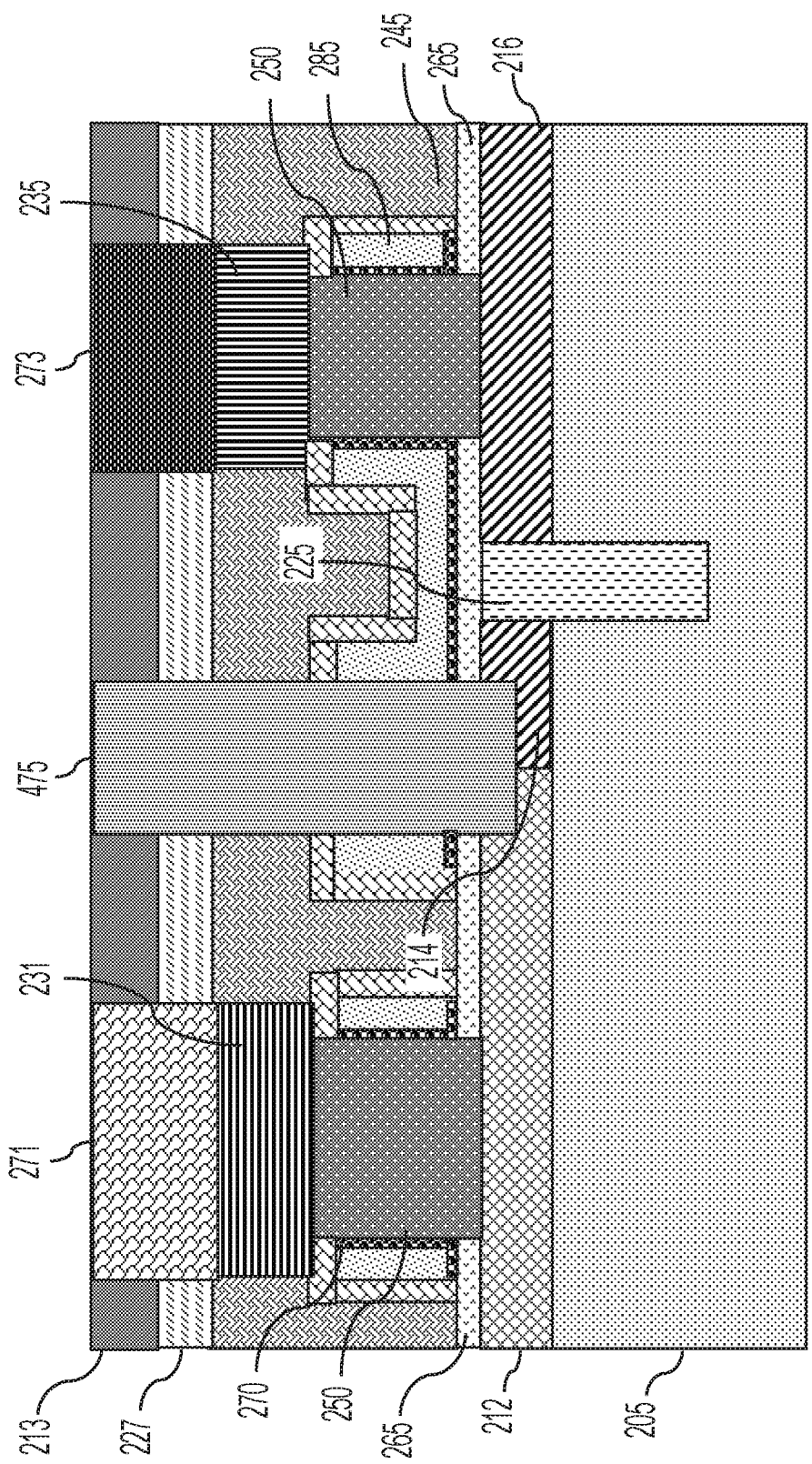
FIG. 16 is a cross-sectional view of a VFET according to one or more embodiments of the present invention which is similar to the VFET structure illustrated in FIG. 15.

FIG. 16 is a cross-sectional view of a VFET structure 100 according to one or more embodiments of the present invention which is similar to the VFET structure 100 of FIG. 15; however, the contact BC 475 is not buried. BC 475 also contacts both the N+ doped region 231 and P+ doped region 235 material. Also, the VFET structure 100 of FIG. 16 can operate without bottom silicide layer 260, if desired.

Figure 17:
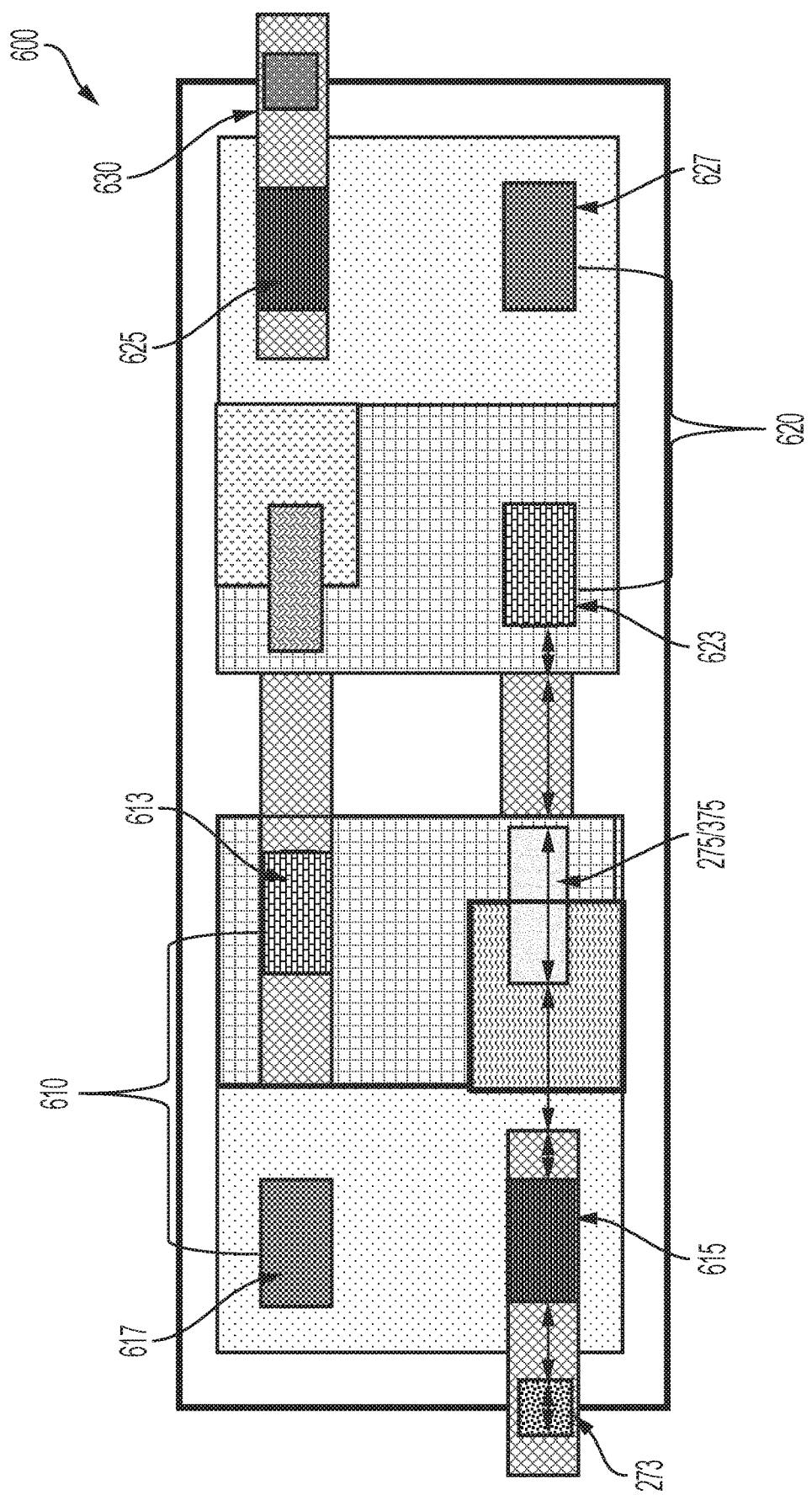
FIG. 17 illustrates a plan view of an SRAM bit-cell layout according to one or more embodiments of the present invention.

FIG. 17 is a plan view of an SRAM bit-cell layout 600 according to one or more embodiments of the present invention. Layout 600 is similar to layout 500 but can utilize a plurality of VFET structures 100 illustrated in FIGS. 15 and 16. The layout 600 includes six transistors: two pairs of complementary VFET transistors (610 and 620, respectively) in which each pair includes pull-up (613 and 623, respectively) and pull-down transistors (617 and 627, respectively). The layout 600 also includes two VFET pass-gate (NFET) transistors (615 and 625, respectively). The layout 600 also includes CB 273 and BC 275 or BC 375, which can be self-aligned to a pass gate, for example, pass gate 615. Accordingly, the gate in layout 600 can be cross-coupled to a bottom S/D.

A pass gate, for example, pass gate 625, can serve as a bit line for the SRAM. The pass gate serving as the bit line can be connected to a word line node (WL) 630. Pull-down 613 can serve as a ground node (VSS) and pull-up transistor 615 can serve as a voltage source node (VDD).

Accordingly, the bottom contacts related to FIGS. 12 and 14 include a BC which resides on a P+ doped region and provides coupling between the P+ doped region and the gate. A silicide layer provides coupling between the P+ doped region and an N+ doped region. The bottom contacts of FIGS. 15 and 16 include a BC which has a portion residing on a P+ doped region and a portion residing on an N+ doped region, which provides coupling between the P+ doped region, the N+ doped region and the gate.

Accordingly, embodiments described herein provide methods and structures for forming a VFET having a self-aligned bottom contact. Self-alignment can occur by placing a dummy fin pillar at the initial stages of fin patterning. A bottom spacer, gate module, top spacer can be formed a top epitaxial growth can be performed. Also, a mask can be used to open an area designated for placement of the bottom contact. A selective etch can be performed to etch the dummy fin pillar down to a bottom source/drain area, and remove a wrapping around high-k material using an isotropic etch. The self-aligned bottom contact can be formed be filling the previously etched area with metal to form a connection between a P+ doped region and a gate.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
a plurality of transistors, wherein each of the plurality of transistors comprises:
a first vertical fin connected to a gate and a first doped region, wherein the first doped region is formed on a substrate;
a second vertical fin connected to the gate and a source or a drain (S/D), wherein the S/D is formed on the substrate; and
a bottom contact connected to and self-aligned with the gate and a second doped region, the bottom contact being formed on the second doped region, a portion of the second doped region being in direct contact with the first doped region;
wherein each of the plurality of transistors is operably connected to form the semiconductor device.

2. The semiconductor device of claim 1, wherein the bottom contact cross-couples the gate to the S/D.

3. The semiconductor device of claim 1, wherein the semiconductor device is a memory cell.

4. The semiconductor device of claim 3, wherein the memory cell is a static random access memory cell.

5. The semiconductor device of claim 4, further comprising a pass gate that serves as a bit line for the static random access memory cell.

6. The semiconductor device of claim 5, further comprising a word line node connected to the bit line.

7. The semiconductor device of claim 6, further comprising a pull-down that serves as a ground node.

8. The semiconductor device of claim 7, further comprising a pull-up transistor that serves as a voltage source node.

9. A semiconductor device comprising:
a plurality of transistors, wherein each of the plurality of transistors comprises:
a first vertical fin connected to a gate and a first doped region, wherein the first doped region is formed on a substrate;
a second vertical fin connected to the gate and a source or a drain (S/D), wherein the S/D is formed on the substrate; and
a buried bottom contact connected to and self-aligned with the gate and a second doped region, the buried bottom contact being formed on the second doped region, a portion of the second doped region being in direct contact with the first doped region;
wherein each of the plurality of transistors is operably connected to form the semiconductor device.

10. The semiconductor device of claim 9, wherein the buried bottom contact cross-couples the gate to the S/D.

11. The semiconductor device of claim 9, wherein the semiconductor device is a memory cell.

12. The semiconductor device of claim 11, wherein the memory cell is a static random access memory cell.

13. The semiconductor device of claim 12, further comprising a pass gate that serves as a bit line for the static random access memory cell.

14. The semiconductor device of claim 13, further comprising a word line node connected to the bit line.

15. The semiconductor device of claim 14, further comprising a pull-down that serves as a ground node.

16. The semiconductor device of claim 15, further comprising a pull-up transistor that serves as a voltage source node.

17. The semiconductor device of claim 9, further comprising a middle of the line interlayer dielectric over the buried bottom contact.

18. A semiconductor device comprising:
a plurality of transistors, wherein each of the plurality of transistors comprises:
a first vertical fin connected to a gate and a first doped region, wherein the first doped region is formed on a substrate;
a second vertical fin connected to the gate and a source or a drain (S/D), wherein the S/D is formed on the substrate; and
a buried bottom contact connected to and self-aligned with the gate and connected to a second doped region and the first doped region, the buried bottom contact being formed in direct contact with the first and second doped regions;
wherein each of the plurality of transistors is operably connected to form the semiconductor device.

19. The semiconductor device of claim 18, wherein the buried bottom contact cross-couples the gate to the S/D.

20. The semiconductor device of claim 18, wherein the semiconductor device is a memory cell.

* * * * *